United States Patent
Menzel et al.

(10) Patent No.: US 11,456,579 B2
(45) Date of Patent: Sep. 27, 2022

(54) SWITCHGEAR MODULE FOR INSTALLATION IN A SWITCHGEAR CABINET AND SWITCHGEAR CABINET INCLUDING SUCH A SWITCHGEAR MODULE

(71) Applicant: ABB Schweiz AG, Baden (CH)

(72) Inventors: Carsten Menzel, Weinheim (DE); Klaus Kraft, Heidelberg (DE); Markus Kesberger, Ludwigshafen (DE); Helen-CaiLun Hu, Fujian (CN)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/060,113

(22) Filed: Oct. 1, 2020

(65) Prior Publication Data
US 2021/0021110 A1 Jan. 21, 2021

Related U.S. Application Data

(63) Continuation of application No. PCT/EP2018/058739, filed on Apr. 5, 2018.

(51) Int. Cl.
*H02B 1/36* (2006.01)
*H05K 7/14* (2006.01)
*H02B 1/21* (2006.01)

(52) U.S. Cl.
CPC .............. *H02B 1/36* (2013.01); *H02B 1/21* (2013.01); *H05K 7/1465* (2013.01)

(58) Field of Classification Search
CPC ........... H02B 1/21; H02B 1/36; H05K 7/1465
See application file for complete search history.

(56) References Cited

U.S. PATENT DOCUMENTS

| | | | |
|---|---|---|---|
| 4,677,524 A | 6/1987 | Shiraishi et al. | |
| 4,681,386 A * | 7/1987 | Boulanger | H01R 13/6275 |
| | | | 439/347 |
| 5,095,403 A | 3/1992 | Pin | |

(Continued)

FOREIGN PATENT DOCUMENTS

| | | |
|---|---|---|
| DE | 10315623 A1 | 10/2004 |
| EP | 0180959 A2 | 5/1986 |

(Continued)

*Primary Examiner* — Robert J Hoffberg
(74) *Attorney, Agent, or Firm* — Leydig, Voit & Mayer, Ltd.

(57) ABSTRACT

A switch gear module for installation in a switch gear cabinet includes: a switch gear module housing, the housing including power circuits and first electrical power devices including breakers, contactors, and motor circuit breakers for supplying electric power to an electric load including an electric motor, and electric control circuits and auxiliary circuits controlling the first electrical power devices. The power circuits and the first electrical power devices are contained in a first power-unit housing forming a first functional power-unit and the electric control circuits and auxiliary circuits are contained in a separate second control- and auxiliary circuit housing forming a second functional control- and auxiliary circuit unit. Each of the first functional power-unit and the second functional control and auxiliary circuit unit includes an interface for connecting the power circuits and electrical power devices contained in the first power-unit housing.

10 Claims, 1 Drawing Sheet

(56) References Cited

U.S. PATENT DOCUMENTS

| | | | |
|---|---|---|---|
| 7,419,394 B2* | 9/2008 | Jensen | H05K 7/1452 |
| | | | 439/248 |
| 7,493,176 B2* | 2/2009 | Merkel | G05B 19/0423 |
| | | | 218/155 |
| 8,727,456 B1 | 5/2014 | Bullock et al. | |
| 8,810,998 B2* | 8/2014 | Feldmeier | H02B 11/12 |
| | | | 361/608 |
| 8,957,334 B1* | 2/2015 | Bullock | H02B 1/36 |
| | | | 200/50.26 |
| 10,594,246 B2* | 3/2020 | Li | H02P 27/045 |
| 2007/0052298 A1 | 3/2007 | Merkel et al. | |
| 2009/0009932 A1 | 1/2009 | Kraft et al. | |

FOREIGN PATENT DOCUMENTS

| | | |
|---|---|---|
| WO | WO 2006105879 A1 | 10/2006 |
| WO | WO 2010086364 A1 | 8/2010 |

* cited by examiner

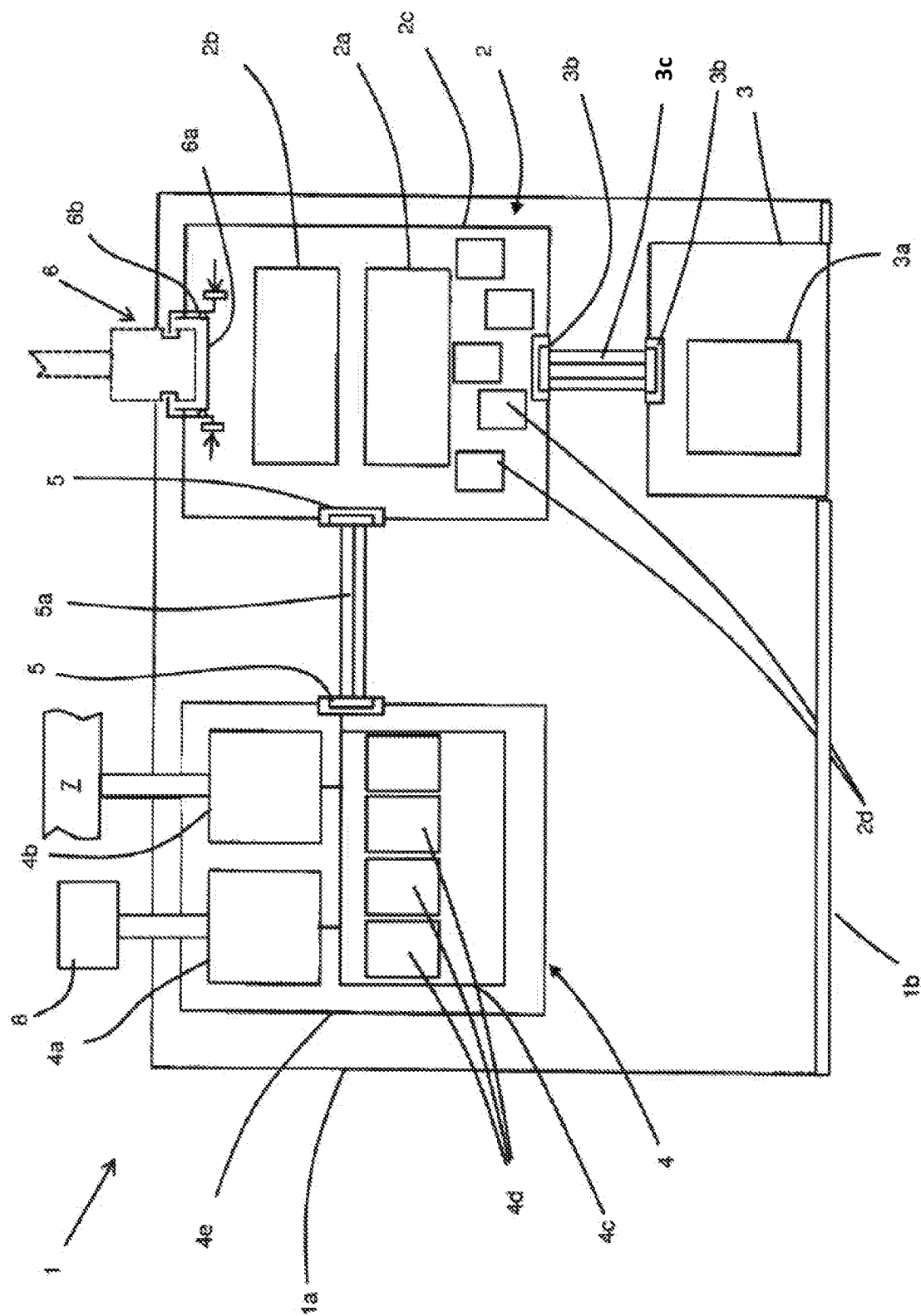

SWITCHGEAR MODULE FOR INSTALLATION IN A SWITCHGEAR CABINET AND SWITCHGEAR CABINET INCLUDING SUCH A SWITCHGEAR MODULE

CROSS-REFERENCE TO PRIOR APPLICATION

This application is a continuation of International Patent Application No. PCT/EP2018/058739, filed on Apr. 5, 2018. The entire disclosure of this application is hereby incorporated by reference herein.

FIELD

The invention is related to a switchgear module, in particular a low voltage switchgear module, for installation in a switchgear cabinet and a switchgear cabinet, in particular a low voltage switchgear cabinet, including such a switchgear module.

BACKGROUND

In low voltage switchgear cabinets, it is known to use switchgear modules for driving electrical loads like electric motors which in one common housing include both, the power circuits and electrical power devices, like for example breakers, contactors and motor circuit breakers, for supplying electric power to an electric load power and the respective control- and auxiliary circuits for e.g. supervising and measuring the parameters of the load.

Due to the large variance of the control- and auxiliary circuits and associated electrical devices with regard to customer applications and requirements, it is virtually impossible to standardize the modules, so that the electrical circuits for the power-units and the auxiliary circuits are nowadays engineered and assembled together based on individual customer needs in one and the same mechanical housing. As a result, most electrical devices used in low voltage switchgears are individual designs which are expensive due to the individual engineering and assembling of the final devices for each individual customer.

SUMMARY

In an embodiment, the present invention provides a switchgear module for installation in a switchgear cabinet, comprising: a switchgear module housing, the housing including power circuits and first electrical power devices comprising breakers, contactors, and motor circuit breakers configured to supply electric power to an electric load comprising an electric motor, and electric control circuits and auxiliary circuits configured to control the first electrical power devices, wherein the power circuits and the first electrical power devices are contained in a first power-unit housing forming a first functional power-unit and the electric control circuits and auxiliary circuits are contained in a separate second control- and auxiliary circuit housing forming a second functional control- and auxiliary circuit unit, and wherein each of the first functional power-unit and the second functional control and auxiliary circuit unit comprises an interface configured to connect the power circuits and electrical power devices contained in the first power-unit housing with the control circuits and auxiliary circuits contained in the second control- and auxiliary circuit housing.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 1 shows a schematic view of a switchgear module of the present invention with the associated components.

DETAILED DESCRIPTION

In an embodiment, the present invention provides a switchgear module which can be manufactured at reduced cost and which allows for a reduction of assembly time.

In an embodiment, the present invention provides a switchgear cabinet which allows a quick replacement of the power circuits and electrical power devices which are used for supplying electric power to an electric load in case of a failure.

According to a first objection of the invention, a switchgear module for installation in a switchgear cabinet comprises a switchgear module housing in which power circuits and electrical power devices like breakers, contactors and motor circuit breakers etc. are included, which serve to supply electric power to an electric load, in particular an electric motor. Moreover, the switchgear module housing also includes at least one electric control circuit and also auxiliary circuits for controlling and supervising the first electrical devices when supplying electric power to the electric load.

According to the invention, the power circuits and the electric power devices are contained in a first power-unit housing, so as to form a first functional power-unit which can be inserted and removed from the switchgear module housing as one piece. Moreover, the aforementioned electric control circuits and the auxiliary circuits together with optional auxiliary devices like sensors, relays, electric metering devices, controller boards and also the electrical components for HMI-interfaces which are adapted to be electrically connected to the control circuits and auxiliary circuits are contained in a separate second control- and auxiliary circuit housing which forms a second functional control- and auxiliary circuit unit. According to the invention, each of the first functional power-unit and the second functional control- and auxiliary circuit unit comprises an interface which is adapted to interconnect the power circuits and electrical power devices contained in the first power-unit housing with the control circuits and auxiliary circuits and optionally the afore-mentioned electrical components mounted in the second housing for an exchange of electrical signals for driving and controlling the electrical loads.

The switchgear module according to the invention provides for the advantage that the first functional power-unit with all its electrical components can be designed and shipped as an off-the-shelf component for electrical loads of a certain range of power which is consumed by the electrical loads. In other words, for electric drives which have a power consumption of e.g. 10-100 W, a first type of functional power-unit can be used which e.g. includes low cost low power components which are adapted to drive loads of e.g. up to 100 W. If it is desired to use the switchgear module for driving loads with a higher power consumption of e.g. 500 W to 1 kW, a second type of functional power-units may be used which is specifically designed for electric loads which consume e.g. not more than 1 KW. A third and further types of functional power—units may include more expensive electric components which are used to supply electric power to loads having a power consumption of up to 1.5 kW or more. However, due to the different types of electrical performance ranges or power ranges of the loads which are to be connected to the switchgear module, the functional power-units can be designed and produced in a cost-effective manner, because it is not necessary to employ e.g. expensive high-power motor circuit breakers when driving only small electric motors with a maximum power consumption of 100 W or less.

According to another aspect of the present invention, the control- and auxiliary circuit housing may comprise mechanical holding elements which are adapted to releasably mount the afore-mentioned optional electrical component like relays and/or switches and/or electric metering devices and/or controller boards and/or HMI interfaces which are used in the individually designed second control circuits and auxiliary circuits at different locations inside the control- and auxiliary circuit housing. By using the afore mentioned mechanical holding elements, the costs for designing and manufacturing the individually designed second functional control- and auxiliary circuit units can be significantly reduced, because the different components inside this unit which are mainly used to control, meter and supervise the electric loads, e.g. by means of sensors, can be positioned at a various positions inside the control- and auxiliary circuit housing by means of the holding elements.

According to a yet further aspect of the invention, the mounting elements may comprise a known top-hat rail to which the electrical components can be clamped by means of clamping elements which are formed or mounted at each of the electrical components. This provides for a very cost effective and reliable way of mounting the components.

According to a further object of the present invention, the switchgear module may comprise a front wall which is preferably part of a frame that is composed of a back wall, side walls, a front wall and a top and a bottom wall. However, instead of using side walls, a top, bottom and rear wall which are directly connected to each other at their edge portions, the frame may also be a skeleton frame which consists of interconnected profiles to which the front panel is attachable. In this embodiment of the invention, the front panel carries at least one front mounted electrical device, like a manual control switch and/or a display panel and/or an optical or acoustical indicator which is electrically connected to a front panel interface and which is used to operate the switchgear module through an operator or display metering and control information of the load on a display. The front panel interface serves for connecting the front mounted devices of the front panel to the control circuits and/or auxiliary circuits and all the electrical components like relays, switches, electric metering devices and/or controller boards etc. which are contained inside the control and auxiliary circuit housing.

Moreover, in this embodiment of the invention, a recess may be formed in the front wall of the housing, in which the front panel is received and mounted to the front wall.

According to the preferred embodiment of the invention, the control circuit and auxiliary circuit contained in the second control- and auxiliary circuit housing are electrically connected to a front panel interface which is adapted to exchange data with the front mounted electrical devices of the front panel. By using a control- and auxiliary circuit interface which may comprise a known interface and a flexible connecting cable for connecting displays to controller boards, the flexibility for producing the switchgear modules of the invention is further increased, because the manufacturing processes of both, the first functional power-unit and also the front panel with its front mounted electrical components can be designed at different locations and by different suppliers.

According to a yet further aspect of the present invention, the control circuits and auxiliary circuits which are contained in the second control and auxiliary circuit housing are electrically connected to a module control interface which is adapted to exchange control data with a remote control console. The module control interface may be a known field bus interface which is adapted to connect the switchgear module to a known field bus system like a CAN bus, that is used to interconnect the electrical modules and components included in a switchgear cabinet or even in a section of a process plant to a central control room from which all the components in the switchgear cabinet are controlled. Moreover, the remote control console may even be a control console in a main control center of a process plant.

In order to provide for an easy mounting and demounting of a switch board module of the invention, the module control interface may comprise a snap-in plug which is located at the rear side of the switchgear module housing.

According to the preferred embodiment, the snap-in plug comprises a locking element, in particular at least one, but preferably two levers, each of which is adapted to lock the snap-in plug after it has been plugged into a complementary plug housing at the rear side of a switchgear cabinet. In order to remove the switchgear module from the associated insert inside a switchgear cabinet, the snap-in plug may be released by pressing on extensions of the spring-biased levers which causes claw-sections of the levers to retract and release a form-fitting connection between the snap-in plug and the associated complementary plug housing of the switchgear cabinet.

According to another aspect of the present invention, the snap-in plugs for connecting the module control interfaces of each functional control- and auxiliary circuit unit with the field bus or generally speaking the control console and also the interfaces and associated interface cables which are used for interconnecting the power circuits and electrical power devices contained in the first power-unit housing with the control circuits and auxiliary circuits contained in the second control and auxiliary circuit housing may be coded. By means of this, a mismatch between a functional power-unit which has been designed for a specific low-power electric load and a functional control- and auxiliary circuit unit which has been individually designed to control a different functional power-unit which is adapted to drive electric loads with a higher power consumption is avoided. Moreover, the different coding may also serve to prevent wrong connections between different functions of the second functional control- and auxiliary circuit units.

According to another aspect of the present invention, a switchgear cabinet includes one or more of the afore-described switchgear modules which are preferably insertable into respective compartments included in a switchgear cabinet.

As it is shown in FIG. 1, a switchgear module 1 for installation in a switchgear cabinet, comprises a switchgear module housing 1a, which includes power circuits 4c and first electrical power devices 4d like e.g. breakers, contactors and motor circuit breakers for supplying electric power to an electric load 8, e.g. an electric motor. The switchgear housing 1 a further includes electric control circuits 2a and auxiliary circuits 2b for controlling the first electrical power devices 4d. The switchgear module is wherein the power circuits 4c and the first electrical power devices 4d are contained in a first power-unit housing 4e so as to provide a first functional power-unit 4. Moreover, also outgoing power contacts 4a and incoming power contacts 4b for connecting the first electrical power devices 4d to the load 8 may also be contained in the first housing 4a. The housing 4a may be made of sheet metal, or may be a skeleton housing which is formed of a plurality of metal profiles which are mechanically interconnected to each in a known manner, e.g. by welding or by means of screws.

As it is further indicated in FIG. 1, the individually designed electric control circuits 2a and auxiliary circuits 2b are contained in a second control- and auxiliary circuit housing 2c which is separate from the first power-unit housing 4a thereby providing a second functional control- and auxiliary circuit unit 2 which can be handled independent of the first functional power-unit 4. According to the invention, each of the first functional power-unit 4 and second functional control- and auxiliary circuit unit 2 comprises an interface 5 for interconnecting the power circuits 4c and electrical power devices 4d contained in the first power-unit housing 4e with the control circuits 2a and auxiliary circuits 2b which are contained in the second control- and auxiliary circuit housing 2c. The interconnection of the two functional units 4 and 2 may be provided by means of a flexible connecting cable 5a, as it is indicated in FIG. 1.

In the control- and auxiliary circuit housing 2c mechanical holding elements may be provided to mount electrical components 2d like relays and/or switches and/or electric metering devices and/or controller boards and/or HMI interfaces etc. which are electrically connected to the control circuits 2a and auxiliary circuits 2b at different locations inside the housing 2c, in order to provide for a higher flexibility when designing the second functional unit.

The switchgear module 1 further comprises a front wall 1b and a front panel 3 which is mounted at the front wall 1b as a separate unit. The front panel 3 carries at least one front mounted electrical device 3a like a manually operated control switch and/or a display panel and/or an optical or acoustical indicator etc. Moreover, the front panel 3 further comprises a front panel interface 3b for electrically connecting the front mounted device 3a to the control circuits 2a and/or auxiliary circuits 2b by means of a flexible cable 3c.

Moreover, the control circuits 2a and auxiliary circuits 2b contained in the second control- and auxiliary circuit housing 2c are electrically connected to a module control interface 6 for exchanging control data with a control console via a data bus, like a field bus system, which is schematically indicated by the busbar 7.

As it is further shown in FIG. 1, the module control interface 6 may comprise a snap-in plug 6a which is located at the rear side of the switchgear module housing 1a.

The snap-in plug 6a may comprise a spring biased locking element 6b in form of two levers which are adapted to mechanically lock the snap-in plug 6a when plugged into a complementary plug housing of a switchgear cabinet. The snap-in plug 6a can be released/opened by pushing on the locking elements 6b with two fingers from inside the switchgear module housing 1 a.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LISTING OF REFERENCE NUMERALS 1 switchgear module
1a switchgear module housing
2 control- and auxiliary circuit unit
2a control circuits
2b auxiliary circuits
2c control and auxiliary circuit housing
2d electrical components
3 front panel
3a front mounted electrical device
3b front panel interface
3c flexible front panel cable
4 functional power-unit
4a outgoing power contacts
4b incoming power contacts
4c power circuits (circuit board)
4d first electrical devices
4e first power-unit housing
5 unit-to-unit interface
5a connecting cable
6 module control interface
6a snap-in plug
6b spring biased locking element
7 main busbar
8 load

What is claimed is:

1. A switchgear module for installation in a switchgear, comprising:
   a switchgear module housing, the switchgear module housing including:
      power circuits,
      first electrical power devices, the first electrical power devices comprising breakers, contactors, and motor circuit breakers each configured to supply electric power to an electric load, the electric load comprising an electric motor, and
      circuit components configured to control the first electrical power devices, the circuit components comprising electric control circuits and auxiliary circuits,
   wherein the power circuits and the first electrical power devices are contained in a first power-unit housing forming a first functional power-unit and the circuit components are contained in a separate second control- and auxiliary circuit housing forming a second functional control- and auxiliary circuit unit, wherein each of the first functional power-unit and the second functional control and auxiliary circuit unit comprises an interface configured to connect the power circuits and the first electrical power devices contained in the first power-unit housing with the circuit components contained in the second control- and auxiliary circuit housing, wherein the interfaces of the first functional power-unit and the second functional control- and auxiliary circuit unit being connected by means of a flexible connecting cable, wherein the interfaces and interface the flexible connecting cable, which are used for interconnecting the power circuits and the first electrical power devices contained in the first power-unit housing with the circuit components contained in the second control- and auxiliary circuit housing, are coded, and wherein the first functional power-unit is configured to be inserted and removed from the switchgear module housing as one piece, and the second functional control- and auxiliary circuit unit is configured to be handled independently of the first functional power-unit.

2. The switchgear module according to claim 1, wherein the second control- and auxiliary circuit housing comprises mechanical holding elements configured to releasably mount electrical components, the electrical components comprising relays and/or switches and/or electric metering devices and/or controller boards and/or HMI interfaces, which are configured to be electrically connected to the circuit components at different locations inside the second control- and auxiliary circuit housing.

3. The switchgear module according to claim 2, wherein the mechanical holding elements comprise a top-hat rail.

4. The switchgear module according to claim 1, further comprising a front wall and a front panel which is configured to be mounted at the front wall, wherein the front panel carries at least one front mounted electrical device, the at least one front mounted electrical device comprising a manual control switch and/or a display panel and/or an optical or acoustical indicator, and the front panel further carries a front panel interface configured to electrically connect the at least one front mounted electrical device of the front panel to the circuit components inside the second control- and auxiliary circuit housing.

5. The switchgear module according to claim 4, wherein the front panel is mounted in a recess formed in the front wall of the switchgear module housing.

6. The switchgear module according to claim 4, wherein the circuit components contained in the second control- and auxiliary circuit housing are electrically connected to the front panel interface so as to exchange data with the at least one front mounted electrical device of the front panel.

7. The switchgear module according to claim 1, wherein the circuit components contained in the second control- and auxiliary circuit housing are electrically connected to a module control interface so as to exchange control data with a control console.

8. The switchgear module according to claim 7, wherein the module control interface comprises a snap-in plug which is located at a rear side of the switchgear module housing.

9. The switchgear module according to claim 8, wherein the snap-in plug comprises a spring biased locking element, the spring biased locking element comprising a lever which is configured to lock the snap-in plug when plugged into a complementary plug housing of a switchgear cabinet, the snap-in plug being releasable by acting on the locking element from inside the switchgear module housing.

10. A switchgear cabinet, comprising:
the switchgear module according to claim 1.

* * * * *